(12) United States Patent
Im et al.

(10) Patent No.: US 10,291,240 B2
(45) Date of Patent: May 14, 2019

(54) DELAY CONTROL DEVICE AND METHOD FOR THE SAME

(71) Applicant: SK hynix Inc., Icheon-si Gyeonggi-do (KR)

(72) Inventors: Da In Im, Icheon-si (KR); Young Suk Seo, Seoul (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 51 days.

(21) Appl. No.: 15/351,910

(22) Filed: Nov. 15, 2016

(65) Prior Publication Data

US 2018/0054206 A1 Feb. 22, 2018

(30) Foreign Application Priority Data

Aug. 16, 2016 (KR) .................. 10-2016-0103623

(51) Int. Cl.
*G11C 7/10* (2006.01)
*G11C 7/22* (2006.01)
*H03L 7/081* (2006.01)

(52) U.S. Cl.
CPC .......... *H03L 7/0812* (2013.01); *G11C 7/1057* (2013.01); *G11C 7/1084* (2013.01); *G11C 7/222* (2013.01)

(58) Field of Classification Search
CPC ... H03L 7/06; H03L 7/08; H03L 7/081; H03L 7/0812; H03L 7/0814; H03L 7/0816; H03L 7/0818; G11C 7/1051; G11C 7/1054; G11C 7/1057; G11C 7/106; G11C 7/1063; G11C 7/1066; G11C 7/1078; G11C 7/1081; G11C 7/1084; G11C 7/1087; G11C 7/109; G11C 7/1093; G11C 7/22
USPC ................ 327/147, 149, 152, 156, 158, 161
See application file for complete search history.

(56) References Cited

U.S. PATENT DOCUMENTS 8,411,517 B2 * 4/2013 Choi ........................ G11C 7/04
327/158
8,704,561 B2    4/2014 Lee et al.
8,797,080 B2 * 8/2014 Bringivijayaraghavan ..................
H03L 7/0816
327/182

FOREIGN PATENT DOCUMENTS

KR     1020120033925 A    4/2012

* cited by examiner

*Primary Examiner* — Lincoln D Donovan
*Assistant Examiner* — Diana J. Cheng
(74) *Attorney, Agent, or Firm* — William Park & Associates Ltd.

(57) ABSTRACT

A delay control device and method are disclosed, which relate to a technology for compensating for a delay difference of a delay locked loop (DLL). The delay control device may include a delay locked loop (DLL) configured to adjust a delay time of a delay line, and compensate for a delay time of a replica delay circuit based on a calibration signal. The delay control device may include a real clock path delay circuit configured to delay an output of the delay locked loop (DLL. The delay control device may include a control signal generator configured to generate the calibration signal in consideration of a difference between the delay time of the replica delay circuit and the delay time of the real clock path delay circuit.

20 Claims, 11 Drawing Sheets

FIG. 11

DELAY CONTROL DEVICE AND METHOD FOR THE SAME

CROSS-REFERENCE TO RELATED APPLICATION

This application claims priority based upon Korean patent application No. 10-2016-0103623, filed on Aug. 16, 2016, the disclosure of which is hereby incorporated in its entirety by reference herein.

BACKGROUND

1. Technical Field

Embodiments of the present disclosure may generally relate to a delay control device and method for the same, and more particularly to a technology for compensating for a delay difference of a delay locked loop (DLL).

2. Related Art

In a semiconductor memory device designed to operate by synchronizing with an external clock signal, if an internal clock signal is delayed more than an external clock signal by a predetermined time, high frequency performance of the semiconductor memory device deteriorates. Specifically, after the external clock signal is applied to the semiconductor memory device, a data output time (i.e., an output data access time (tAC)) is elongated.

Therefore, in order to prevent deterioration of the high-frequency performance of the semiconductor memory device, a circuit for accurately synchronizing the phase of an internal clock signal to the phase of an external clock signal is needed. For this purpose, a delay locked loop (DLL) is used.

The delay locked loop (DLL) controls delay of a delay loop using a replica. The replica is a copy of a clock path or a data path, and the amount of delay of the delay loop is determined according to the amount of replica delay.

The delay locked loop (DLL) copies a real clock path delay as a replica delay. The replica delay and the real clock path delay may be changed according to PVT (Process, Voltage, Temperature) or the like. In this case, the degree of twist (or dislocation) between the clock signal and a data strobe signal (DQS) is changed according to the process, the voltage, and the temperature (PVT), respectively.

SUMMARY

In accordance with an embodiment, a delay control device may be provided. The delay control device may include a delay locked loop (DLL) configured to adjust a delay time of a delay line, and compensate for a delay time of a replica delay circuit based on a calibration signal. The delay control device may include a real clock path delay circuit configured to delay an output of the delay locked loop (DLL. The delay control device may include a control signal generator configured to generate the calibration signal in consideration of a difference between the delay time of the replica delay circuit and the delay time of the real clock path delay circuit.

In accordance with an embodiment, a delay control method may be provided. The delay control method may include adjusting a delay time of a delay line by comparing a reference clock signal with a feedback clock signal. The delay control method may include delaying an output of the delay line by selecting a first clock path delay circuit, and generating a first lock signal corresponding to a first clock delay time. The delay control method may include delaying the output of the delay line by selecting a second clock path delay circuit, generating a second lock signal corresponding to a second clock delay time. The delay control method may include compensating for a delay time based on a calibration signal. The delay control method may include generating the calibration signal in consideration of a time difference between the first clock delay time and the second clock delay time.

DETAILED DESCRIPTION

Reference will now be made to the embodiments of the present disclosure, examples of which are illustrated in the accompanying drawings. Wherever possible, the same reference numbers will be used throughout the drawings to refer to the same or like parts.

Various embodiments of the present disclosure may be directed to providing a delay control device and method for the same that substantially obviate one or more problems due to limitations and disadvantages of the related art.

An embodiment of the present disclosure may relate to a delay control device for compensating for a delay difference between a replica delay circuit of a delay locked loop (DLL) and a real clock path delay circuit.

Figure 1:
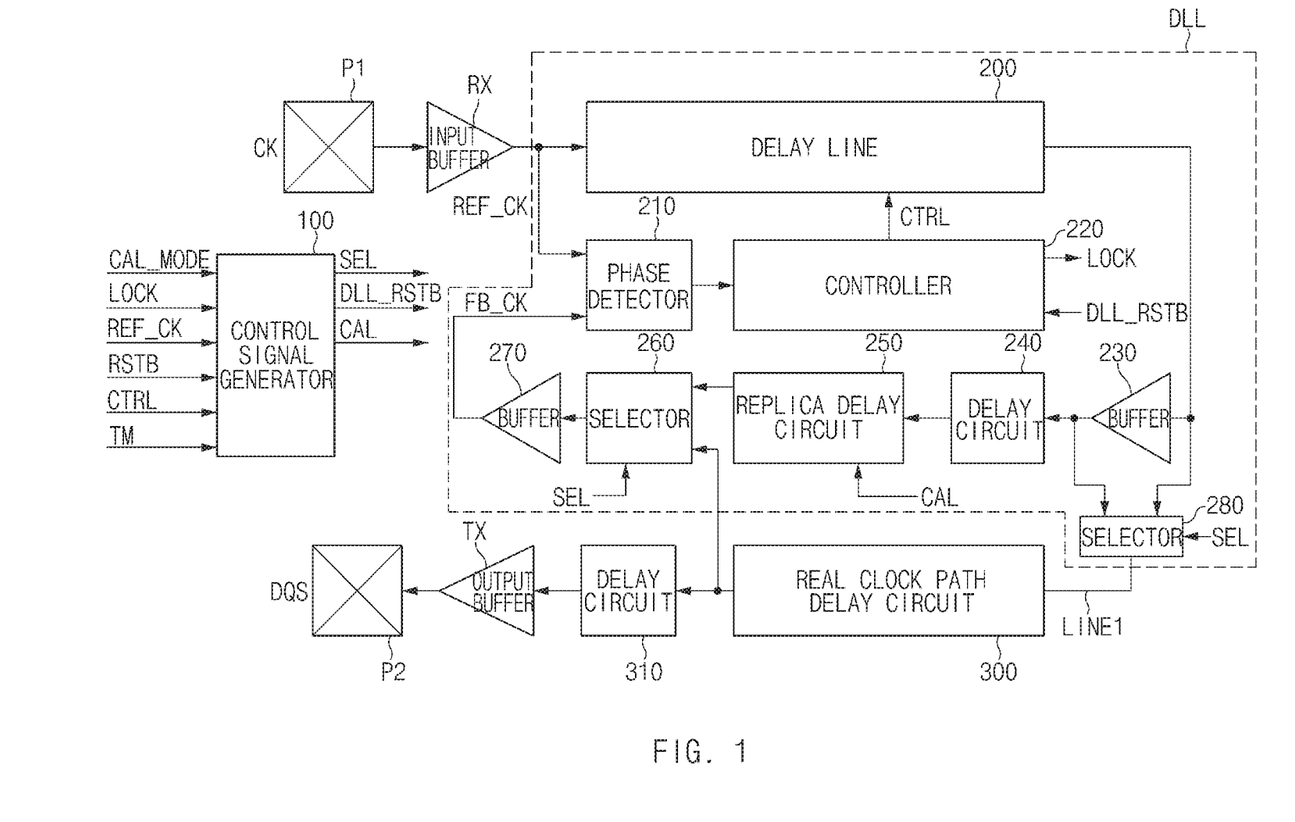
FIG. 1 is a block diagram illustrating a representation of an example of a delay control device according to an embodiment of the present disclosure.

FIG. 1 is a block diagram illustrating a representation of an example of a delay control device according to an embodiment of the present disclosure.

Referring to FIG. 1, the delay control device may include a plurality of pads (P1, P2), an input buffer (RX), an output buffer (TX), a delay locked loop (DLL), a control signal generator 100, a real clock path delay circuit 300, and a delay circuit 310.

The delay locked loop (DLL) may include a delay line 200, a phase detector 210, a controller 220, buffers (230, 270), a delay circuit (240), a replica delay circuit 250, and selectors (260, 280).

In this case, the pad (P1) may be an input pad for, for example but not limited to, a clock signal (CK). An input buffer (RX) may buffer the clock signal (CK) received from the pad (P1), and may output the buffered clock signal to the delay line 200 and the phase detector 210.

The control signal generator 100 may generate a selection signal (SEL), a reset signal (DLL_RSTB), and a calibration signal (CAL), upon receiving a calibration mode signal (CAL_MODE), a lock signal (LOCK), a reference clock signal (REF_CK), a reset signal (RSTB), a control signal (CTRL), and a test mode signal (TM).

The delay line 200 may adjust the amount of delay of the reference clock signal (REF_CK) received from the input buffer (RX) in response to the control signal (CTRL), and may output the adjusted result to the buffer 230. The phase detector 210 may detect the phase of a feedback clock signal (FB_CK) according to the reference clock signal (REF_CK), and may output the detected result to the controller 220. In an embodiment, the delay locked loop DLL may be configured to adjust a delay time of the delay line 200 in response to the control signal CTRL by comparing the reference clock signal REF_CK with the feedback clock signal FB_CK.

The controller 220 may output a lock signal (LOCK) to the control signal generator 100 in response to the output of the phase detector 210, and may output the control signal (CTRL) to the delay line 200. The controller 220 may be reset in response to the reset signal (DLL_RSTB).

The buffer 230 may buffer the output of the delay line 200, and may output the buffered result to the delay circuit 240. The delay circuit 240 may delay the output of the buffer 230, and may output the delayed result to the replica delay circuit 250. In this case, the delay circuit 240 may correspond to a dummy delay line, and may adjust a delay time as necessary.

The replica delay circuit 250 may adjust the amount of delay of the signal received from the delay circuit 240 in response to the calibration signal (CAL), and may output the adjusted resultant signal to the selector 260. In this case, the calibration signal (CAL) may be used to compensate for a difference between a delay time of the real clock path delay circuit 300 and a delay time of the replica delay circuit 250. The replica delay circuit 250 may compensate for a delay time difference of the real clock path delay circuit 300 using the calibration signal (CAL).

The selector 260 may select any one of the output of the replica delay circuit 250 and the output of the real clock path delay circuit 300 in response to the selection signal (SEL), and may output the selected one to the buffer 270. The buffer 270 may buffer the output of the selector 260, and may output the feedback clock signal (FB_CK) to the phase detector 210.

The selector 280 may select any one of the output of the delay line 200 and the output of the buffer 230 in response to the selection signal (SEL), and may output the selected one to the real clock path delay circuit 300. In this case, the selector 280 of the delay locked loop (DLL) may be coupled to the real clock path delay circuit 300 through a line (LINE1).

The real clock path delay circuit 300 may be configured to delay an output of the delay locked loop DLL. For example, the real clock path delay circuit 300 may delay the output of the selector 280, and may output the delayed result to the selector 260 and the delay circuit 310. The delay circuit 310 may delay the output of the real clock path delay circuit 300, and may output the delayed result to the output buffer (TX). In this case, the delay circuit 310 may correspond to the dummy delay line, and may adjust the delay time as necessary.

The output buffer (TX) may buffer the output of the delay circuit 310, and may output the buffered result to the pad (P2). The pad (P2) may be used to output, for example but not limited to, the data strobe signal (DQS).

The delay locked loop (DLL) may perform timing alignment between the clock signal (CK) and the data strobe signal (DQS). The replica delay circuit 250 may copy the input buffer (RX), the output buffer (TX), and the real clock path delay circuit 300. However, there may arise a time difference between the clock signal (CK) and the data strobe signal (DQS) according to the accuracy of the replica delay circuit 250.

Therefore, an embodiment of the present disclosure may detect a delay difference between a first loop having passed through the real clock path delay circuit 300 and a second loop having passed through the replica delay circuit 250. An embodiment may adjust a delay time of the replica delay circuit 250 by reflecting a delay difference between two paths using the calibration signal (CAL), such that a time difference between the clock signal (CK) and the data strobe signal (DQS) can be reduced.

Figure 2:
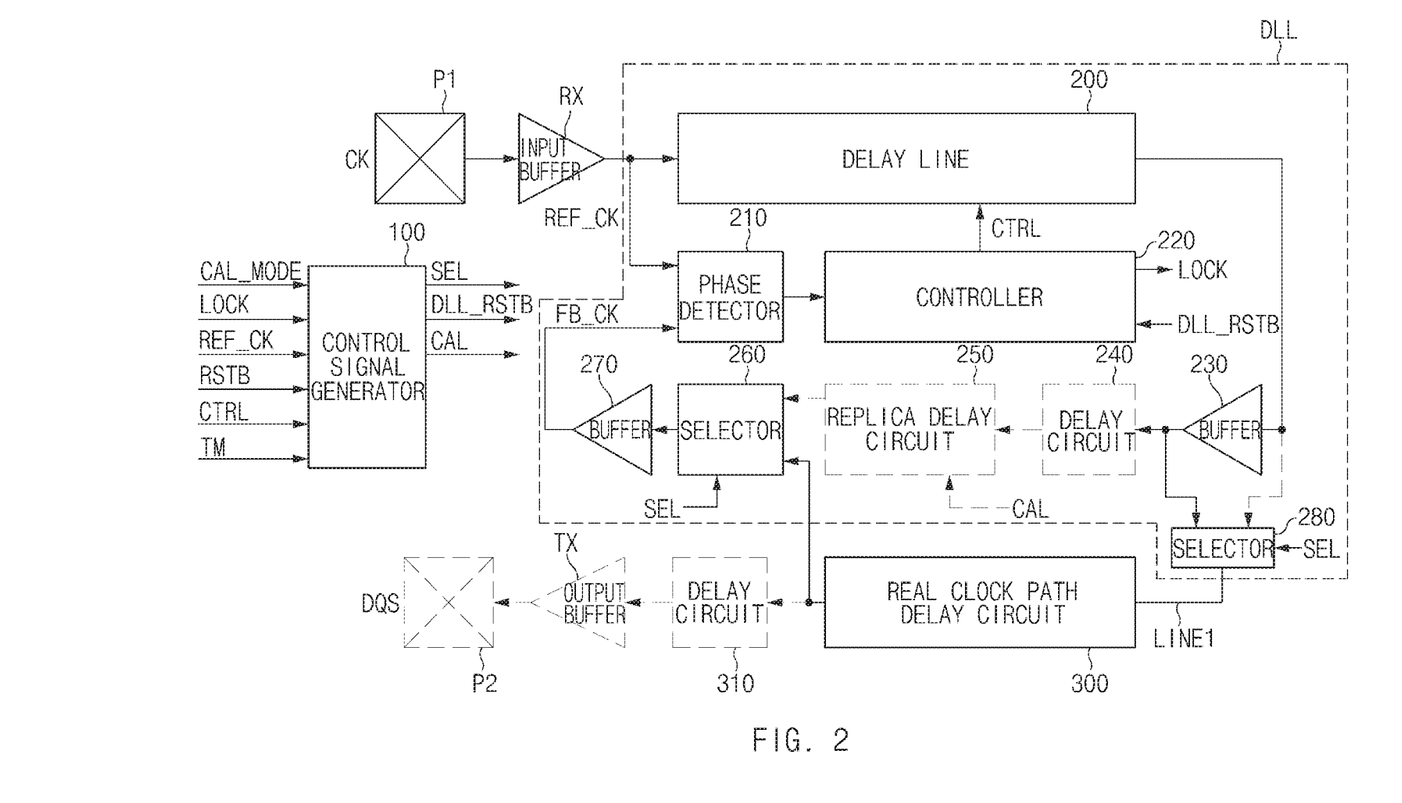
FIGS. 2 and 3 are conceptual diagrams illustrating the operation paths of a delay locked loop (DLL) for use in the delay control device illustrated in FIG. 1.
Figure 3:
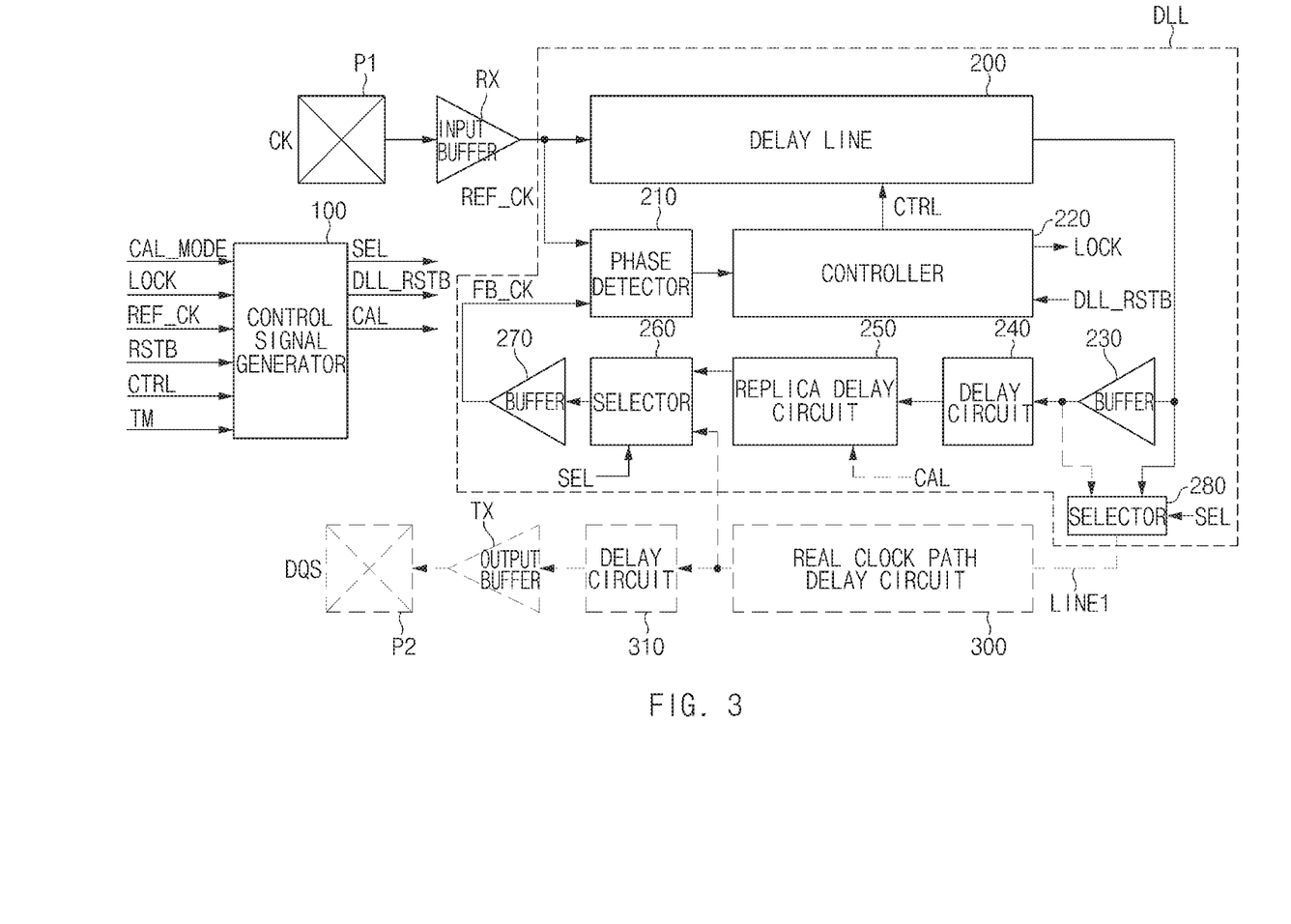

FIGS. 2 and 3 are conceptual diagrams illustrating representations of examples of the operation paths of a delay locked loop (DLL) for use in the delay control device illustrated in FIG. 1. In an embodiment, a path including the input buffer, the delay line 200, the phase detector 210, and the controller 220 will hereinafter be referred to as a first delay path. In addition, as illustrated in FIG. 2, a path for selecting the real clock path delay circuit (i.e., the first clock path delay circuit) will hereinafter be referred to as a second delay path. In addition, as illustrated in FIG. 3, a path for selecting the replica delay circuit (i.e., the second clock path delay circuit) will hereinafter be referred to as a third delay path.

First, a first lock operation may operate as illustrated in the path of FIG. 2. The input received through the pad P1 may be buffered by the input buffer (RX). Thereafter, the output signal having passed through the delay line 200 and the buffer 230 may be transferred to the selector 280.

In the first lock loop, the selector 280 may select the output of the buffer 230 using the selection signal (SEL). For example, if the selection signal (SEL) is denoted by "0", the selector 280 may select the output of the buffer 230, and may couple the selected output to the line (LINE1). Subsequently, the output of the selector 280 may be transferred to the selector 260 after passing through the real clock path delay circuit 300.

Thereafter, the selector 260 may select the output of the real clock path delay circuit 300 using the selection signal (SEL), and may output the selected output to the buffer 270. The buffer 270 may buffer the output of the selector 260, and may output the feedback clock signal (FB_CK) to the phase detector 210.

The phase detector 210 may compare the reference clock signal (REF_CK) with the feedback clock signal (FB_CK), may detect the phase of the feedback clock signal (FB_CK), and may output the detected phase to the controller 220. The controller 220 may generate the control signal (CTRL) according to the output of the phase detector 210, and may output the generated control signal (CTRL) to the delay line 200. The delay line 200 may lock the delay loop in response to the control signal (CTRL).

As described above, the first lock operation may select the real clock path delay circuit 300 using the selectors (260, 280), and may generate the feedback clock signal (FB_CK). The lock signal (LOCK) generated by the first lock operation may refer to a first lock signal (F_LOCK) to be described later.

A second lock operation may operate as illustrated in the path of FIG. 3. The clock signal received through the pad (P1) may be buffered by the input buffer (RX). Thereafter, the output signal having passed through the delay line 200 may be transferred to the buffer 230 and to the selector 280.

In the second lock loop, the selector 280 may not transfer the output of the delay line 200 to the real clock path delay circuit 300. For example, if the selection signal (SEL) is denoted by "1", the selector 280 may cut off or sever the connection between the output of the buffer 230 and the line (LINE1). As a result, the output of the delay line 200 may be applied to the replica delay circuit 250 after passing through the buffer 230 and the delay circuit 240.

Thereafter, the selector 260 may select the output of the replica delay circuit 250 using the selection signal (SEL), and may output the selected output to the buffer 270. As a result, the buffer 270 may buffer the output of the selector 260, and may output the feedback clock (FB_CK) to the phase detector 210.

The phase detector 210 may compare the reference clock signal (REF_CK) with the feedback clock signal (FB_CK), may detect the phase of the feedback clock signal (FB_CK), and may output the detected result to the controller 220. The controller 220 may generate the control signal (CTRL) according to the output of the phase detector 210, and may output the generated control signal (CTRL) to the delay line 200. The delay line 200 may lock the delay loop in response to the control signal (CTRL).

As described above, the second lock operation may select the replica delay circuit 250 using the selectors (260, 280), and may generate the feedback clock signal (FB_CK). The lock signal (LOCK) generated by the second lock operation may refer to a second lock signal (S_LOCK) to be described later.

An embodiment of the present disclosure may detect a first clock delay time by passing through the lock path of the real clock path delay circuit 300 as illustrated in FIG. 2. In addition, an embodiment may detect a second clock delay time after passing through the lock path of the replica delay circuit 250 as illustrated in FIG. 3. If the delay time of the real clock path delay circuit 300 is changed from the delay time of the replica delay circuit 250, an embodiment may detect a difference between the delay time of the real clock path delay circuit 300 and the delay time of the replica delay circuit 250, and may compensate for the delay time of the replica delay circuit 250 on the basis of the detected difference.

Figure 4:
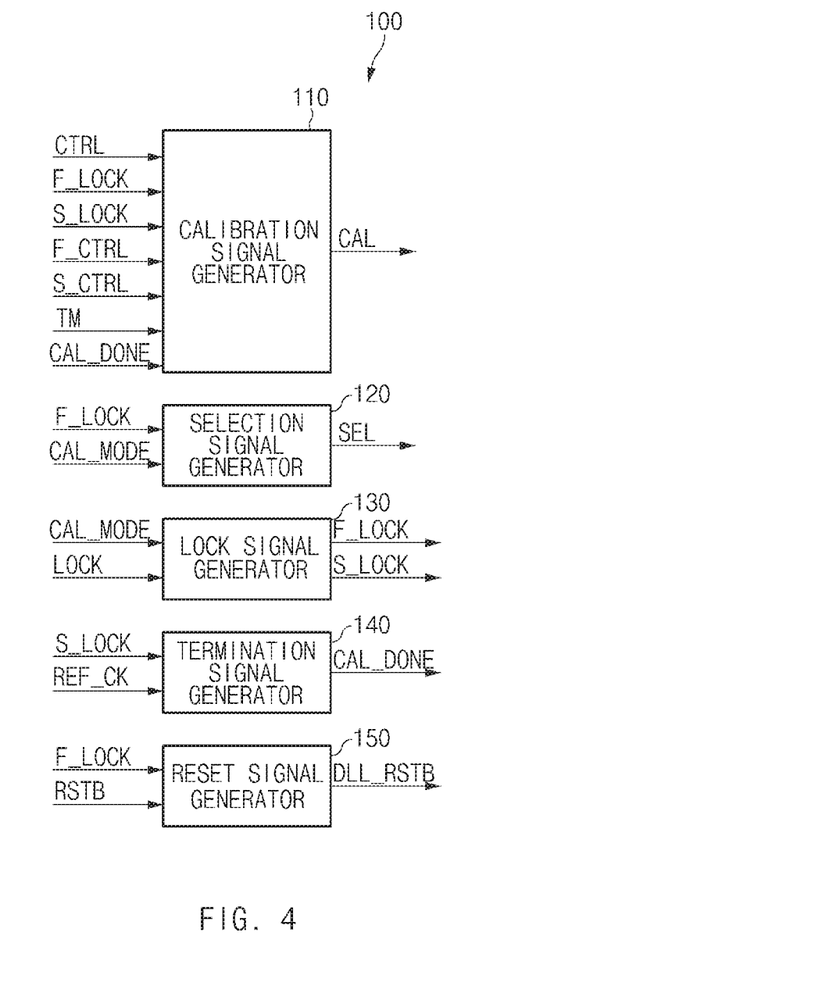
FIG. 4 is a circuit diagram illustrating a representation of an example of a control signal generator illustrated in FIG. 1.

FIG. 4 is a circuit diagram illustrating a representation of an example of the control signal generator 100 illustrated in FIG. 1.

Referring to FIG. 4, the control signal generator 100 may include a calibration signal generator 110, a selection signal generator 120, a lock signal generator 130, a termination signal generator 140, a reset signal generator 150.

The calibration signal generator 110 may generate the calibration signal (CAL) for adjusting the amount of delay of the replica delay circuit 250, upon receiving the control signal (CTRL), the first lock signal (F_LOCK), the second lock signal (S_LOCK), the first calibration control signal (F_CTRL), the second calibration control signal (S_CTRL), the test mode signal (TM), and the calibration completion signal (CAL_DONE).

The selection signal generator 120 may generate the selection signal (SEL) for selecting the path of the lock loop, upon receiving the first lock signal (F_LOCK) and the calibration mode signal (CAL_MODE). The lock signal generator 130 may generate the first lock signal (F_LOCK) for controlling the first lock path and the second lock signal (S_LOCK) for controlling the second lock path, upon receiving the calibration mode signal (CAL_MODE) and the lock signal (LOCK).

The termination signal generator 140 may generate the calibration completion signal (CAL_DONE) for terminating the calibration operation, upon receiving the second lock signal (S_LOCK) and the reference clock signal (REF_CK). The reset signal generator 150 may generate the reset signal (DLL_RSTB) for resetting the operation of the delay locked loop (DLL), upon receiving the first lock signal (F_LOCK) and the reset signal (RSTB).

Figure 5:
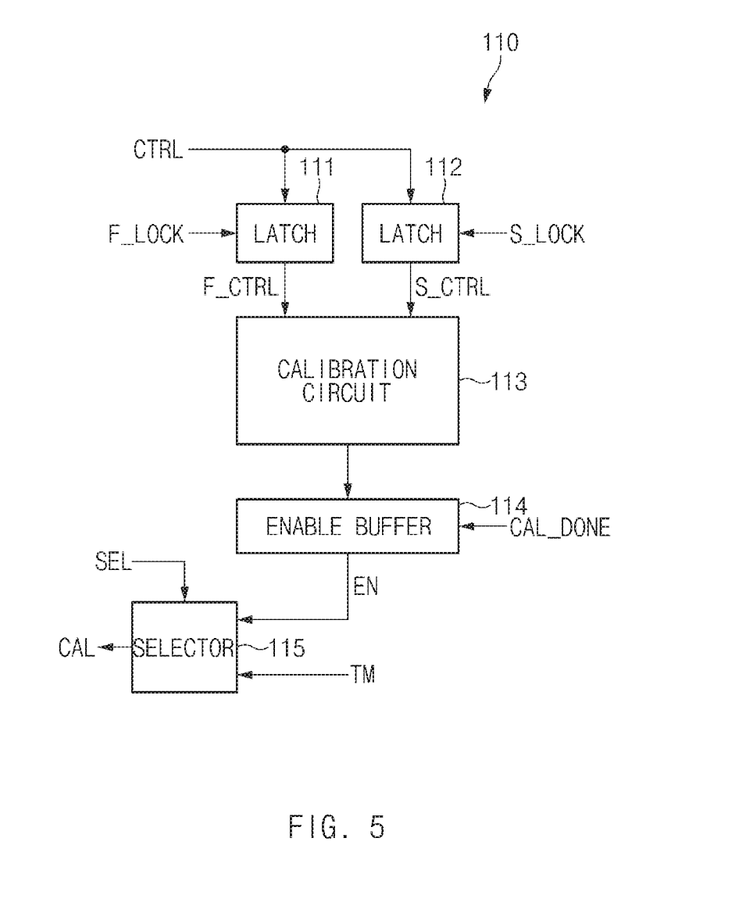
FIG. 5 is a circuit diagram illustrating a representation of an example of a calibration signal generator illustrated in FIG. 4.

FIG. 5 is a circuit diagram illustrating a representation of an example of the calibration signal generator 110 illustrated in FIG. 4.

Referring to FIG. 5, the calibration signal generator 110 may include a plurality of latch circuits (111, 112), a calibration circuit 113, an enable buffer 114, and a selector 115.

In this case, the latch circuit 111 may latch the control signal (CTRL) according to the first lock signal (F_LOCK) initially generated along the same path as in FIG. 2, and may output the first calibration control signal (F_CTRL). The latch circuit 112 may latch the control signal (CTRL) according to the second lock signal (S_LOCK) generated along the same path as in FIG. 3, and may output the second calibration control signal (S_CTRL).

That is, an embodiment of the present disclosure may apply the first calibration control signal (F_CTRL) generated by the first DLL lock process and the second calibration control signal (S_CTRL) generated by the second DLL lock process to the calibration operation of the calibration circuit 113.

The calibration circuit 113 may detect a time difference between the first calibration control signal (F_CTRL) and the second calibration control signal (S_CTRL). In this case, the calibration circuit 113 may be implemented as a subtractor. That is, the calibration circuit 113 may calculate a difference between the first calibration control signal (F_CTRL) and the second calibration control signal (S_CTRL), and may output the calculated difference to the enable buffer 114.

The enable buffer 114 may buffer the output of the calibration circuit 114, and may output the enable signal (EN). In this case, the enable buffer 114 may deactivate the enable signal (EN) in response to the calibration completion signal (CAL_DONE).

The selector 115 may select any one of the enable signal (EN) and the test mode signal (TM) according to the selection signal (SEL), and may output the selected one as the calibration signal (CAL). The selector 115 may also control the code value of the calibration signal (CAL) through the external test mode signal (TM) but not the output of the calibration circuit 113, according to the selection signal (SEL).

Figure 6:
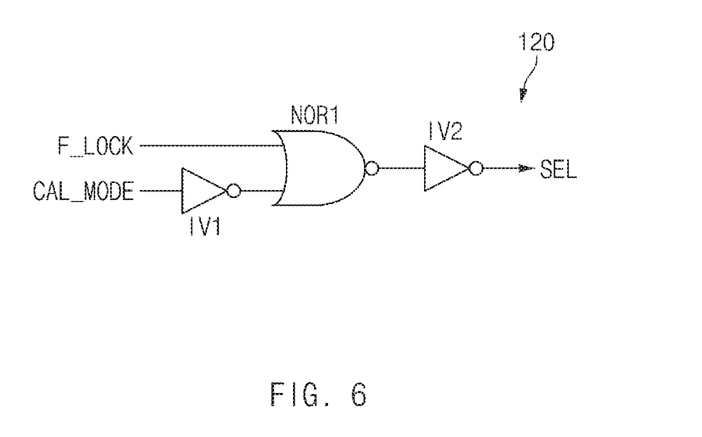
FIG. 6 is a circuit diagram illustrating a representation of an example of a selection signal generator illustrated in FIG. 4.

FIG. 6 is a circuit diagram illustrating a representation of an example of the selection signal generator 120 illustrated in FIG. 4.

Referring to FIG. 6, the selection signal generator 120 may include a plurality of inverters (IV1, IV2) and a NOR gate (NOR1). In this case, the NOR gate (NOR1) may perform a NOR operation between the first lock signal (F_LOCK) and the calibration mode signal (CAL_MODE) inverted by the inverter (IV1). The inverter (IV2) may output the selection signal (SEL) by inverting the output of the NOR gate (NOR1).

If the calibration mode signal (CAL_MODE) is at a high level, the selection signal generator 120 may control the selection signal (SEL) in response to a logic level of the first lock signal (F_LOCK). If the calibration mode signal (CAL_MODE) is at a low level, the selection signal (SEL) may remain high in level, irrespective of the first lock signal (F_LOCK).

For example, when the first lock signal (F_LOCK) is activated, the selection signal (SEL) is activated. On the other hand, when the second lock signal (F_LOCK) is deactivated, the selection signal (SEL) is deactivated.

Figure 7:
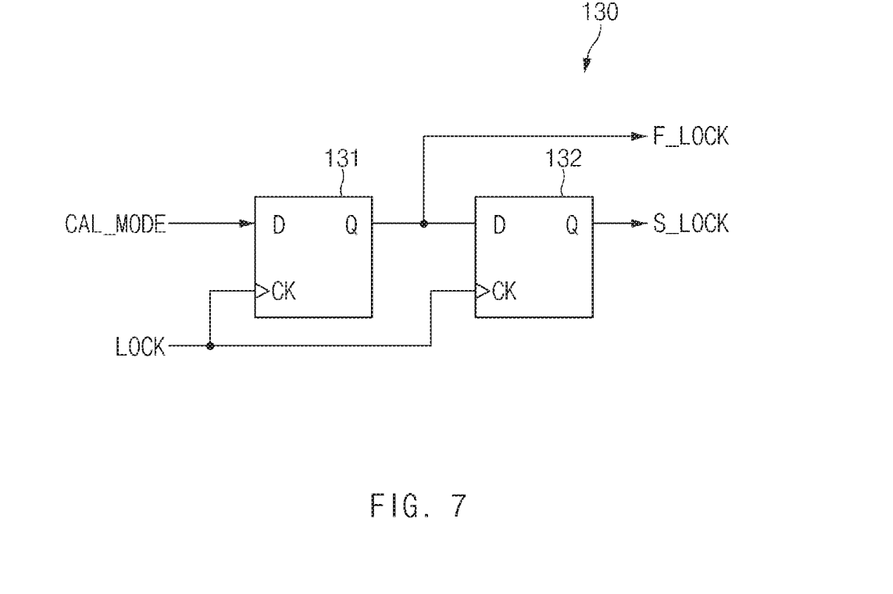
FIG. 7 is a circuit diagram illustrating a representation of an example of a lock signal generator illustrated in FIG. 4.

FIG. 7 is a circuit diagram illustrating a representation of an example of the lock signal generator 130 illustrated in FIG. 4.

Referring to FIG. 7, the lock signal generator 130 may include a plurality of flip-flops (131, 132). In this case, the flip-flop 131 may flip-flop the calibration mode signal (CAL_MODE) in response to the lock signal (LOCK), and may output the first lock signal (F_LOCK). The flip-flop 132 may flip-flop the first lock signal (F_LOCK) in response to the lock signal (LOCK), and may output the second lock signal (S_LOCK).

The above-mentioned lock signal generator 130 may activate the first lock signal (F_LOCK) by synchronizing with the first lock signal (LOCK). Thereafter, the lock signal generator 130 may activate the second lock signal (S_LOCK) by synchronizing with the second lock signal (LOCK). That is, the signal generated by the first lock operation of FIG. 2 may be the first lock signal (F_LOCK), and the signal generated by the second lock operation of FIG. 3 may be the second lock signal (S_LOCK).

For example, assuming that the calibration mode signal (CAL_MODE) is at a high level and the first lock signal (F_LOCK) is at a low level, the selection signal (SEL) becomes low in level. Thereafter, in the first lock operation, the first lock signal (F_LOCK) may transition to a high level on the condition that the calibration mode signal (CAL_MODE) is at a high level. As a result, the selection signal (SEL) is at a high level such that the delay locked loop (DLL) is reset.

After that, during the second lock operation, if the second lock signal (S_LOCK) is at a high level, the calibration operation is continuously performed until the calibration completion signal (CAL_DONE) is activated.

Figure 8:
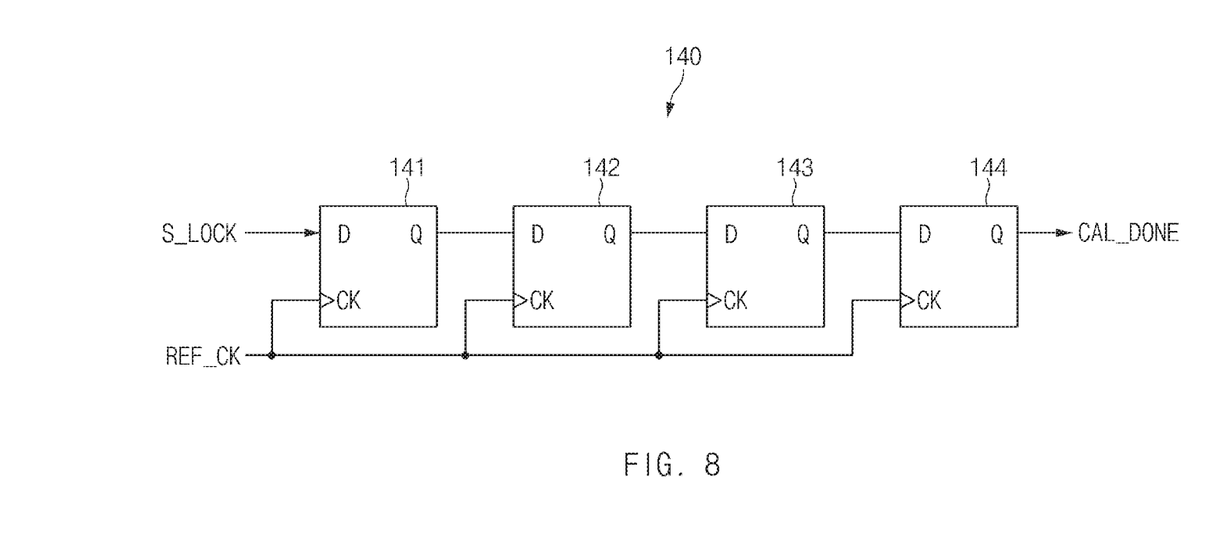
FIG. 8 is a circuit diagram illustrating a representation of an example of a termination signal generator illustrated in FIG. 4.

FIG. 8 is a circuit diagram illustrating a representation of an example of the termination signal generator 140 illustrated in FIG. 4.

Referring to FIG. 8, the termination signal generator 140 may include a plurality of flip-flops 141 to 144.

The flip-flop 141 may flip-flop the second lock signal (S_LOCK) in response to the reference clock signal (REF_CK). The flip-flop 142 may flip-flop the output of the flip-flop 141 in response to the reference clock signal (REF_CK). The flip-flop 143 may flip-flop the output of the flip-flop 142 in response to the reference clock signal (REF_CK). The flip-flop 144 may flip-flop the output of the flip-flop 143 in response to the reference clock signal (REF_CK), and may output the calibration completion signal (CAL_DONE).

The termination signal generator 140 may sequentially flip-flop the second lock signal (S_LOCK) by synchronizing with the reference clock signal (REF_CK), and may output the calibration completion signal (CAL_DONE).

Figure 9:
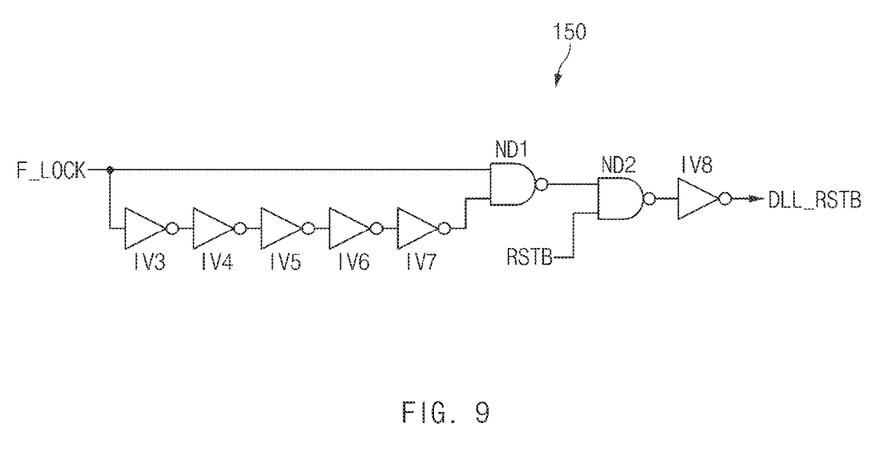
FIG. 9 is a circuit diagram illustrating a representation of an example of a reset signal generator illustrated in FIG. 4.

FIG. 9 is a circuit diagram illustrating a representation of an example of the reset signal generator 150 illustrated in FIG. 4.

Referring to FIG. 9, the reset signal generator 150 may include a plurality of inverters (IV3~IV8) and a plurality of NAND gates (ND1, ND2).

In this case, the plurality of inverters (IV3~IV7) may perform non-inversion delaying of the first lock signal (F_LOCK). The NAND gate (ND1) may perform a NAND operation between the first lock signal (F_LOCK) and the output of the inverter (IV7). The NAND gate (ND2) may perform a NAND operation between the output of the NAND gate (ND1) and the reset signal (RSTB). The inverter (IV8) may invert the output of the NAND gate (ND2), and may output the reset signal (DLL_RSTB).

If the reset signal (RSTB) is activated after lapse of a predetermined time under the condition that the reset signal generator 150 receives the first lock signal (F_LOCK), the reset signal generator 150 may activate the reset signal (DLL_RSTB) for resetting the controller 220 of the delay locked loop (DLL).

Figure 10:
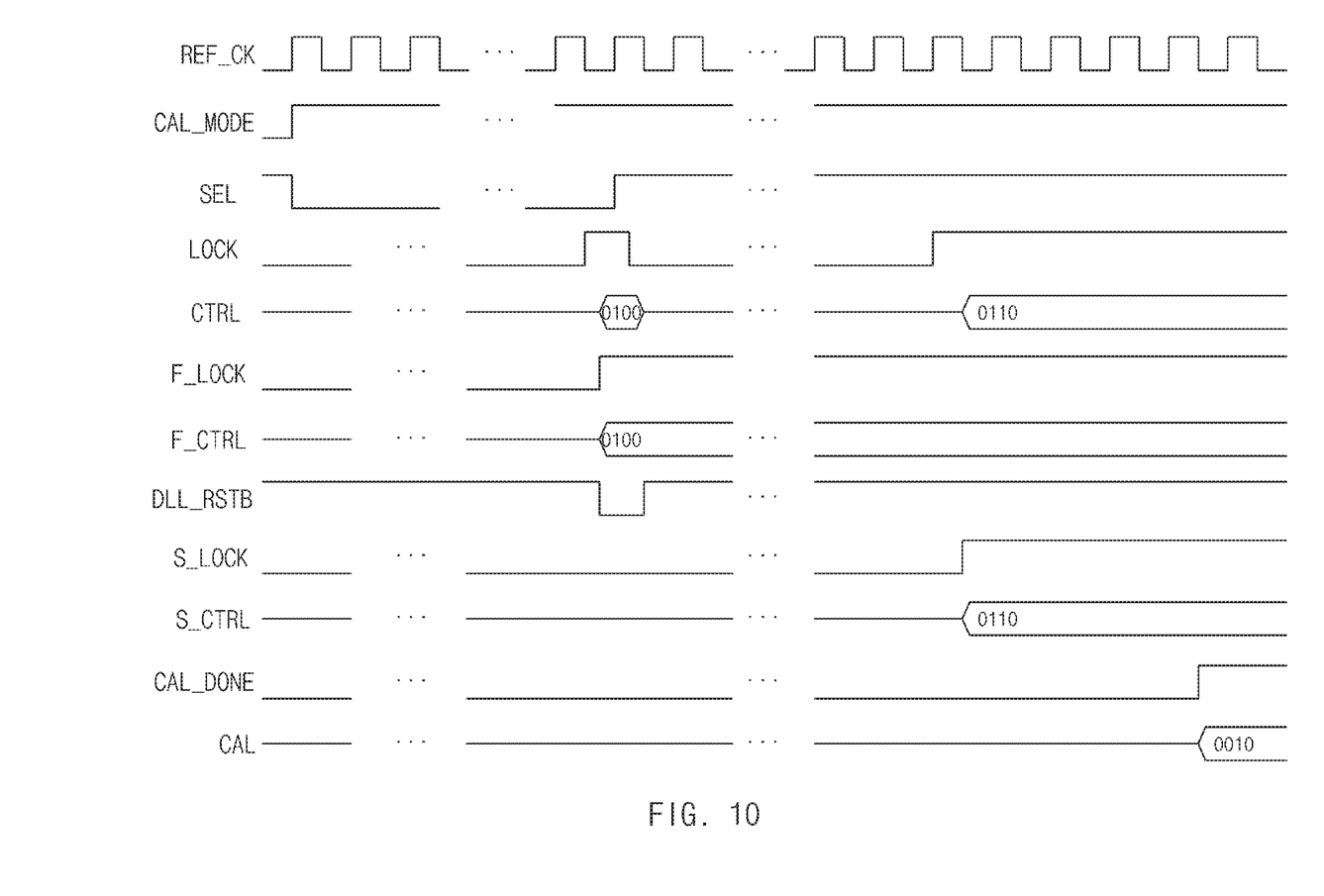
FIG. 10 is a timing diagram illustrating the operations of the delay control device according to an embodiment of the present disclosure.

FIG. 10 is a timing diagram illustrating a representation of an example of the operations of the delay control device according to an embodiment of the present disclosure.

Referring to FIG. 10, upon receiving the clock signal (CK) through the pad (P1), the input buffer (RX) may buffer the clock signal (CK) such that the reference clock signal (REF_CK) toggled at intervals of a predetermined time is generated.

Thereafter, assuming that the calibration mode signal (CAL_MODE) is activated to a high level, the delay control device may enter the calibration mode. Thus, assuming, at first, the lock signal (LOCK) is activated, the first lock signal (F_LOCK) may be activated to a high level. If the first lock signal (F_LOCK) is activated to a high level, the selection signal (SEL) may be activated to a high level by the selection signal generator 120.

If the first lock signal (F_LOCK) is activated, the latch circuit 111 may latch the control signal (CTRL), and may output the latched control signal as the first calibration control signal (F_CTRL). For example, assuming that the control signal (CTRL) has a code value "0100" during the first lock operation, the latch circuit 111 may latch the control signal (CTRL) and thus output the first calibration control signal (F_CTRL) having the code value "0100".

In this case, if the reset signal (RSTB) is activated to a low level, the reset signal (DLL_RSTB) is activated to a low level such that the controller 220 is reset.

Thereafter, when, secondly, the lock signal (LOCK) is activated, the second lock signal (S_LOCK) is activated to a high level. If the second lock signal (S_LOCK) is activated, the latch circuit 112 may latch the control signal (CTRL) and thus output the second calibration control signal (S_CTRL). For example, assuming that the control signal (CTRL) has a code value "0110" during the second lock operation, the latch circuit 112 may latch the control signal (CTRL) and thus output the second calibration control signal (S_CTRL) having the code value "0110".

Subsequently, after lapse of a delay time of the flip-flops (141~144) on the condition that the second control signal (S_CTRL) is activated, the calibration completion signal (CAL_DONE) may be activated to a high level. As a result, the enable buffer 114 may activate the enable signal (EN).

If the enable signal (EN) is activated, the calibration circuit 113 of the calibration signal generator 110 may calculate a difference between the first code value "0100" and the second code value "0110", and may output the code signal "0010" according to the calculated result. As a result, the calibration signal generator 110 may output the calibration signal (CAL) having the code value "0010" to the replica delay circuit 250.

In other words, the delay code value detected by the first lock loop is compared with the other delay code value detected by the second lock loop, the calibration signal generator 110 may detect a difference between the two delay code values. If the calibration completion signal (CAL_DONE) is activated, the calibration signal (CAL) is output to the replica delay circuit 250, such that a delay time can be compensated for.

Figure 11:
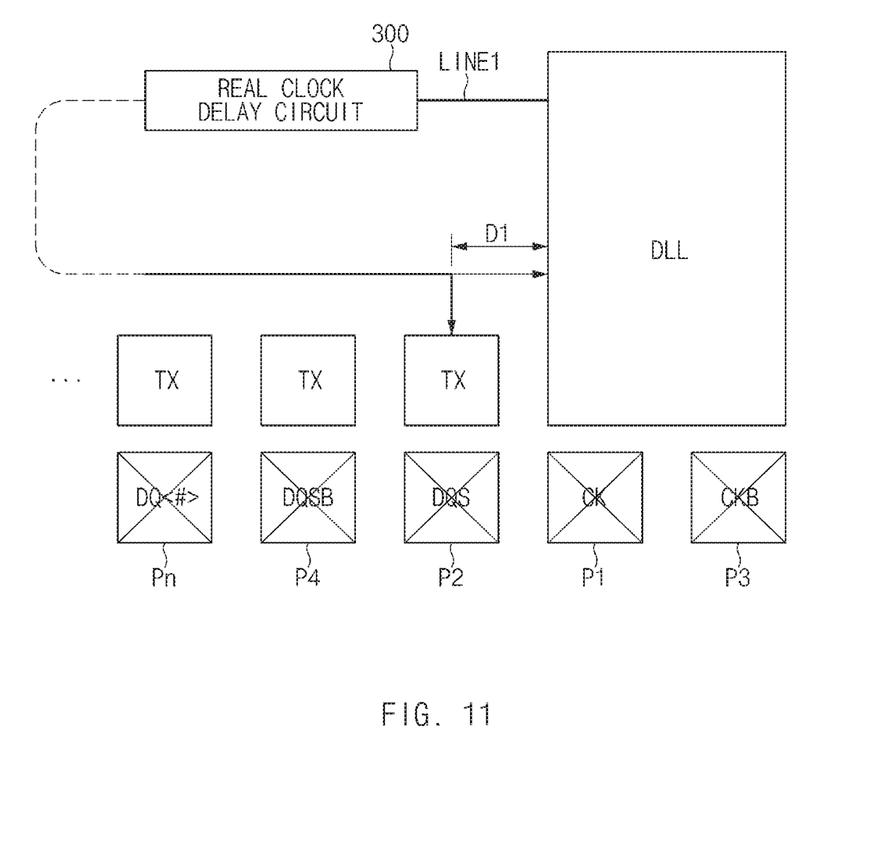
FIG. 11 is a conceptual diagram illustrating a representation of an example of the position of buffers for use in the delay control device according to an embodiment of the present disclosure.

FIG. 11 is a conceptual diagram illustrating a representation of an example of the position of buffers for use in the delay control device according to an embodiment of the present disclosure.

Referring to FIG. 11, the phase detector 210 may compare the feedback clock signal (FB_CK) having passed through the real clock path delay circuit 300 with the reference clock signal (REF_CK) having passed through the input buffer (RX). If the pads (P1, P3) are located far away from the delay locked loop (DLL), load may be generated in the delay line.

As a result, a delay time between the feedback clock signal (FB_CK) of the input buffer (RX) and the reference clock signal (REF_CK) lengthens. For this purpose, according to an embodiment, the input pad (P1) of the clock signal (CK) and the input pad (P3) of the clock signal (CKB) need to be located adjacent to the delay locked loop (DLL).

Likewise, according to an embodiment, the output buffer (TX), the pad (P2) for outputting the data strobe signal (DQS), the pad (P4) for outputting the data strobe signal (DQSB), and the pad (Pn) for outputting the data (DQ) (i.e., DQ<#>, where # is a number) need to be located adjacent to the delay locked loop (DLL).

The real clock path delay circuit 300 may be coupled to the delay locked loop (DLL) through the line (LINE1). The output signal of the real clock path delay circuit 300 may be output to the pad (P2) through the output buffer (TX).

The output signal of the real clock path delay circuit 300 may also be input to the selector 260 of the delay locked loop (DLL). In this case, as a distance (D1) between the output terminal of the real clock path delay circuit 300 and the delay locked loop (DLL) is gradually reduced, a delay difference between the real clock path delay circuit 300 and the replica delay circuit 250 is also reduced. As a result, according to the present disclosure, the output buffer (TX) is located adjacent to the delay locked loop (DLL).

As is apparent from the above description, the delay control device and method according to the embodiments can compensate for a delay difference of a delay locked loop (DLL) such that it can reduce a time difference between a clock signal and data generated according to PVT change.

Those skilled in the art will appreciate that the examples of embodiments may be carried out in other specific ways than those set forth herein without departing from the spirit and essential characteristics of the disclosure. The above embodiments are therefore to be construed in all aspects as illustrative and not restrictive. The scope of the application should be determined by the appended claims and their legal equivalents, not by the above description. Further, all changes coming within the meaning and equivalency range of the appended claims are intended to be embraced therein. In addition, it is obvious to those skilled in the art that claims that are not explicitly cited in each other in the appended claims may be presented in combination as an embodiment or included as a new claim by a subsequent amendment after the application is filed.

Although a number of illustrative embodiments consistent with the disclosure have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. A delay control device comprising:
   a delay locked loop (DLL) configured to adjust a delay time of a delay line by comparing a reference clock signal with a feedback clock signal, and compensate for a delay time of a replica delay circuit in response to a calibration signal;
   a real clock path delay circuit configured to delay an output of the delay locked loop (DLL); and
   a control signal generator configured to generate a selection signal and the calibration signal in consideration of a difference between the delay time of the replica delay circuit and the delay time of the real clock path delay circuit,
   wherein the replica delay circuit is configured to copy the real clock path delay circuit, and adjust a delay time in response to the calibration signal; and
   wherein an output signal of the delay line is output to the real clock path delay circuit or output to the replica delay circuit based on the selection signal.

2. The delay control device according to claim 1, wherein the delay locked loop (DLL) includes:
   the delay line configured to delay the reference clock signal based on a control signal;
   the replica delay circuit configured to adjust a delay time based on the calibration signal;
   a selector configured to select a path scheduled to pass through the real clock path delay circuit or a path scheduled to pass through the replica delay circuit based on the selection signal;
   a phase detector configured to compare the feedback clock signal having passed through the selector with the reference clock signal; and
   a controller configured to output the control signal and a lock signal based on an output of the phase detector.

3. The delay control device according to claim 1, wherein the delay locked loop (DLL) further includes:
   a first buffer configured to buffer an output of the delay line, and output the buffered output to the replica delay circuit;
   a second buffer configured to buffer the feedback clock signal, and output the buffered feedback clock signal to a phase detector; and
   a first delay circuit configured to delay an output of the first buffer.

4. The delay control device according to claim 3, wherein the selector further includes:
   a first selector configured to output the output of the delay line to the real clock path delay circuit; and
   a second selector configured to select an output of the real clock path delay circuit based on the selection signal to output the selected output to the second buffer, or output the output of the replica delay circuit to the second buffer.

5. The delay control device according to claim 1, wherein:
a first pad to which a clock signal is input;
an input buffer configured to generate the reference clock signal by buffering the clock signal received from the first pad;
a second delay circuit configured to delay an output of the real clock path delay circuit;
an output buffer configured to buffer an output of the second delay circuit; and
a second pad configured to output a data strobe signal through the output buffer.

6. The delay control device according to claim 5, wherein:
the first pad, the input buffer, the output buffer, and the second pad are located adjacent to the delay locked loop (DLL).

7. The delay control device according to claim 1, wherein the control signal generator is configured to detect a difference between a delay time corresponding to a first lock signal having passed through the real clock path delay circuit during a first lock operation and another delay time corresponding to a second lock signal having passed through the replica delay circuit during a second lock operation, and control the calibration signal on the basis of the detected difference.

8. The delay control device according to claim 1, wherein the control signal generator includes:
a calibration signal generator configured to latch a control signal based on a lock signal, and generate the calibration signal in consideration of a difference between a delay time of the replica delay circuit and a delay time of the real clock path delay circuit.

9. The delay control device according to claim 8, wherein the calibration signal generator includes:
a first latch configured to latch the control signal based on a first lock signal, and output a first calibration control signal;
a second latch configured to latch the control signal based on a second lock signal, and output a second calibration control signal;
a calibration circuit configured to detect the delay-time difference based on the first calibration control signal and the second calibration control signal; and
an enable buffer configured to output the calibration signal by buffering an output of the calibration circuit based on a calibration completion signal,
wherein the first lock signal and the second lock signal are sequentially activated at intervals of a predetermined time.

10. The delay control device according to claim 9, wherein the calibration signal generator further includes:
a third selector configured to select any one of an output of the enable buffer and a test mode signal according to the selection signal, and output the selected one as the calibration signal.

11. The delay control device according to claim 9, wherein the calibration circuit includes a subtractor.

12. The delay control device according to claim 1, wherein the control signal generator includes:
a selection signal generator configured to control the selection signal based on a first lock signal when a calibration mode signal is activated;
a lock signal generator configured to flip-flop a lock signal when the calibration mode signal is activated, and thus sequentially output the first lock signal and a second lock signal;
a termination signal generator configured to flip-flop the second lock signal based on the reference clock signal, and thus generate a calibration completion signal; and
a reset signal generator configured to generate a second reset signal for resetting the delay locked loop (DLL) based on the first lock signal and a first reset signal.

13. A delay control device comprising:
a first delay path configured to delay a reference clock signal based on a control signal, compare the reference clock signal with a feedback clock signal, and generate the control signal for adjusting a delay time of a delay line;
a second delay path configured to select a first clock path delay circuit when a selection signal is at a first logic level, and generate the feedback clock signal by delaying an output of the first delay path; and
a third delay path configured to select a second clock path delay circuit when the selection signal is at a second logic level, buffer the output of the first delay path, delay the output of the first delay path, compensate for a delay time based on a calibration signal, and output the feedback clock signal.

14. The delay control device according to claim 13, wherein the first delay path includes:
a delay line configured to delay the reference clock signal based on the control signal;
a phase detector configured to compare the feedback clock signal with the reference clock signal; and
a controller configured to output the control signal based on an output of the phase detector.

15. The delay control device according to claim 13, wherein the second delay path includes:
a first selector configured to select a path scheduled to pass through the first clock path delay circuit based on the selection signal; and
the first clock path delay circuit configured to delay an output of the first selector.

16. The delay control device according to claim 13, wherein the third delay path includes:
a first buffer configured to buffer the output of the first delay path;
a delay circuit configured to delay an output of the first buffer;
a second clock path delay circuit configured to copy the first clock path delay circuit, and adjust the delay time based on the calibration signal;
a second selector configured to select a path scheduled to pass through the second clock path delay circuit based on the selection signal; and
a second buffer configured to generate the feedback clock signal by buffering an output of the second selector.

17. The delay control device according to claim 13, further comprising:
a control signal generator configured to generate the calibration signal in consideration of a difference between a delay time of the first clock path delay circuit and a delay time of the second clock path delay circuit.

18. A delay control method comprising:
delaying a reference clock;
adjusting a delay time of a delay line by comparing the reference clock signal with a feedback clock signal;
selecting a first clock path delay circuit based on a selection signal;

delaying an output of the delay line by selecting the first clock path delay circuit, and generating the feedback clock signal and a first lock signal corresponding to a first code value;

selecting a second clock path delay circuit based on the selection signal;

delaying the output of the delay line by selecting the second clock path delay circuit, generating a second lock signal corresponding to a second code value, and compensating for a delay time of a replica delay circuit including the second clock path delay circuit in response to a calibration signal; and calculating a difference between the first code value and the second code value and generating the calibration signal, wherein an output signal of the delay line is output to the first clock path delay circuit or output to the second clock path delay circuit based on the selection signal.

19. The delay control method according to claim 18, further comprising:

generating the first code value based on the first lock signal scheduled to pass through the first clock path delay circuit, during a first lock operation;

generating the second code value based on the second lock signal scheduled to pass through the second clock path delay circuit, during a second lock operation.

20. A delay control device comprising:

a delay locked loop configured to adjust a delay time of a delay line, and detect a first clock delay time based on passing a clock signal through a first lock loop including a real clock path delay circuit and detect a second clock delay time based on passing a clock signal through a second lock loop including a replica delay circuit;

the real clock path delay circuit configured to delay an output of the delay locked loop (DLL); and a control signal generator configured to generate a selection signal and a calibration signal for compensating for a delay time of the replica delay circuit based on the detected difference between the first clock delay time and the second clock delay time wherein the delay locked loop is configured to adjust a delay time of the replica delay circuit in response to the calibration signal, and wherein an output signal of the delay line is output to the real clock path delay circuit or output to the replica delay circuit based on the selection signal.

* * * * *